(12) United States Patent
Park et al.

(10) Patent No.: US 9,202,802 B2
(45) Date of Patent: Dec. 1, 2015

(54) SEMICONDUCTOR APPARATUS HAVING THROUGH VIA CAPABLE OF TESTING CONNECTIVITY OF THROUGH VIA

(71) Applicant: SK hynix Inc., Icheon-si Gyeonggi-do (KR)

(72) Inventors: Heat Bit Park, Icheon-si (KR); Jong Chern Lee, Icheon-si (KR); Hong Gyeom Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/189,083

(22) Filed: Feb. 25, 2014

(65) Prior Publication Data

US 2015/0115435 A1  Apr. 30, 2015

(30) Foreign Application Priority Data

Oct. 24, 2013  (KR) .................. 10-2013-0127193

(51) Int. Cl.
*H01L 23/48* (2006.01)
*H01L 25/065* (2006.01)

(52) U.S. Cl.
CPC .......... *H01L 25/0657* (2013.01); *H01L 23/481* (2013.01); *H01L 2224/11* (2013.01); *H01L 2225/06541* (2013.01); *H01L 2924/0002* (2013.01)

(58) Field of Classification Search
CPC ..... H01L 24/17; H01L 25/0657; H01L 25/50; H01L 23/481; H01L 22/32; H01L 2924/0002; H01L 24/05; H01L 24/16; H01L 24/73; H01L 24/94; H01L 2224/05009; H01L 2224/0557; H01L 2224/05572; H01L 2224/16145; H01L 2224/16146; H01L 2224/17051; H01L 2224/73204; H01L 2224/94; H01L 225/06513; H01L 2225/06541; H01L 25/065; H01L 23/482
USPC .......... 257/774, 773, 775, 776, 608, 60, 208, 257/211, 203, 207, 737, 738, E23.021, 257/E21.499, E21.521; 438/107, 17; 365/63, 233.11
See application file for complete search history.

(56) References Cited

U.S. PATENT DOCUMENTS

| | | | |
|---|---|---|---|
| 8,971,676 B1 * | 3/2015 | Thacker et al. ................. | 385/14 |
| 2011/0292708 A1 * | 12/2011 | Kang et al. ....................... | 365/63 |
| 2012/0112361 A1 * | 5/2012 | Han et al. ....................... | 257/774 |
| 2012/0153498 A1 * | 6/2012 | Kang et al. ..................... | 257/774 |
| 2012/0212990 A1 * | 8/2012 | Park et al. ....................... | 365/63 |
| 2013/0032947 A1 * | 2/2013 | Park et al. ..................... | 257/774 |
| 2014/0175673 A1 * | 6/2014 | Kim et al. ..................... | 257/777 |
| 2014/0264848 A1 * | 9/2014 | Son et al. ...................... | 257/737 |
| 2015/0008588 A1 * | 1/2015 | Kim et al. ..................... | 257/774 |
| 2015/0028450 A1 * | 1/2015 | Park et al. ..................... | 257/532 |
| 2015/0061120 A1 * | 3/2015 | Yang et al. .................... | 257/737 |
| 2015/0061725 A1 * | 3/2015 | Lee ............................ | 324/762.02 |
| 2015/0115268 A1 * | 4/2015 | Park .............................. | 257/48 |

FOREIGN PATENT DOCUMENTS

KR       101212777 B1   12/2012
KR     1020130007120 A    1/2013

* cited by examiner

*Primary Examiner* — Alexander Oscar Williams
(74) *Attorney, Agent, or Firm* — William Park & Associates Ltd.

(57) ABSTRACT

A semiconductor apparatus with a through via includes a semiconductor chip and a through via formed by penetrating through the semiconductor chip. The system further includes a first metal layer connected to a portion of the through via at an end of the through via and a second metal layer connected to another portion of the through via at the end of the through via.

14 Claims, 5 Drawing Sheets

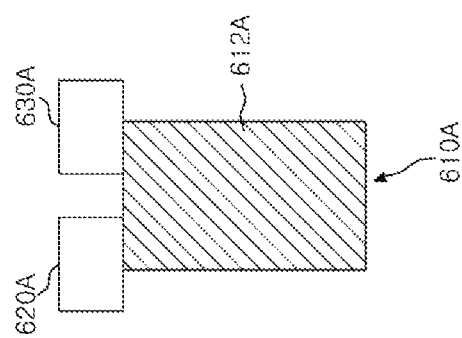
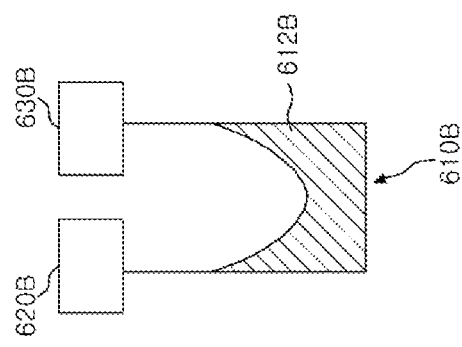
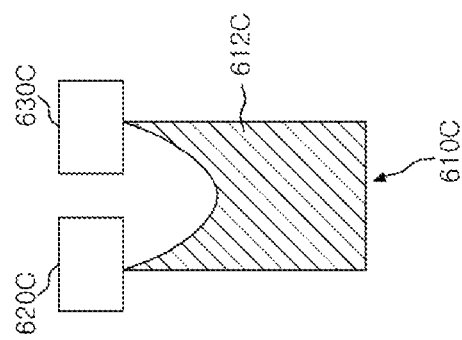

SEMICONDUCTOR APPARATUS HAVING THROUGH VIA CAPABLE OF TESTING CONNECTIVITY OF THROUGH VIA

CROSS-REFERENCES TO RELATED APPLICATION

The present application claims priority under 35 U.S.C. §119(a) to Korean application number 10-2013-0127193, filed on Oct. 24, 2013 in the Korean Intellectual Property Office, which is incorporated herein by reference in its entirety as set forth in full.

BACKGROUND

1. Technical Field

Various embodiments relate to a semiconductor apparatus, and more particularly, to a semiconductor apparatus including a through silicon via (TSV) are provided. The TSV may be stacked with other chips.

2. Related Art

There has been provided a three dimensional (3D) semiconductor apparatus, with which a plurality of chips are stacked and packaged in a single package, for higher integration thereof. More recent uses include a through silicon via (TSV), with which the stacked chips are penetrated and electrically connected through a silicon via.

FIG. 1 is a schematic diagram illustrating a semiconductor chip, where a TSV is formed.

Referring to FIG. 1, the TSV 12 is formed to pass through the semiconductor chip 11. The semiconductor chip 11 is penetrated to form a via hole and a silicon insulating layer 13 is formed around the via hole. A conductive material 14 is then filled in the via hole, thereby forming a through electrode or a through line capable of transferring an electrical signal.

A metal layer 15 is formed over the TSV 12. The metal layer 15 covers an upper portion of the TSV 12 and is electrically coupled to internal circuits (not shown) of the semiconductor chip 11. Therefore, the internal circuits of the semiconductor chip 11 receive a signal from the TSV 12 or transfer a signal to the TSV 12 through the metal layer 15.

A bump 16 is stacked over the metal layer 15 and coupled to another TSV of another semiconductor chip. Therefore, the semiconductor chip 11 can be electrically coupled to and stacked with another semiconductor chip.

SUMMARY

One or more various embodiments are provided to a semiconductor apparatus having a "through silicon via" (TSV), over which a plurality of separated metal layers are formed, and capable of testing connectivity of the TSV.

In an embodiment, a semiconductor apparatus may include a semiconductor chip, a through via formed by penetrating through the semiconductor chip, a first metal layer coupled to a portion of the through via at an end of the through via and a second metal layer coupled to another portion of the through via at the end of the through via.

In an embodiment, a semiconductor apparatus may include a through via, a first metal layer coupled to a portion of the through via at an end of the through via; a second metal layer coupled to another portion of the through via at the end of the through via; a first internal circuit coupled to the first metal layer and configured to transmit a signal to the through via or receive a signal transferred through the through via; and a second internal circuit coupled to the second metal layer and configured to store a signal transferred through the through via and output the stored signal to the through via.

In an embodiment, a system including a semiconductor apparatus may include a semiconductor chip, a through via formed by penetrating through the semiconductor chip, a first metal layer coupled to a portion of the through via at an end of the through via and a second metal layer coupled to another portion of the through via at the end of the through via.

BRIEF DESCRIPTION OF THE DRAWINGS

Features, aspects and embodiments are described in conjunction with the attached drawings, in which:

FIGS. 6A to 6C are schematic diagrams illustrating through the through vias filled with various forms of conductive material and metal layers coupled thereto.

DETAILED DESCRIPTION

Herein, a system including a semiconductor apparatus and a semiconductor apparatus will be described below with reference to the accompanying figures through exemplary embodiments.

Figure 1:
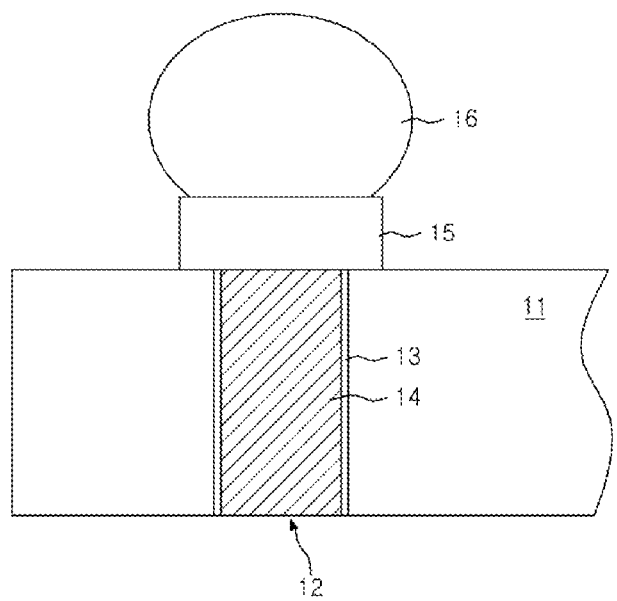
FIG. 1 is a schematic diagram illustrating a semiconductor chip, where a TSV is formed.
Figure 2:
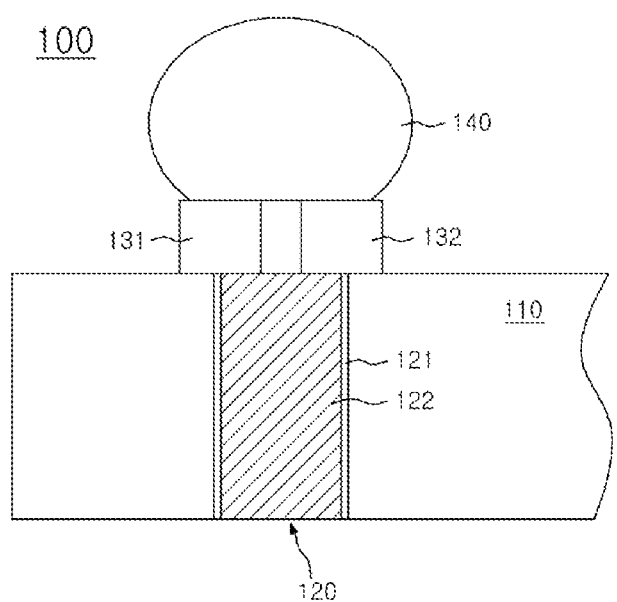
FIG. 2 is a schematic diagram illustrating a semiconductor apparatus in accordance with an embodiment.

Referring to FIG. 2, a system including a semiconductor apparatus 100 may include a semiconductor chip 110, a through via 120, first and second metal layers 131 and 132 and a bump 140. The through via (TSV) 120 may be formed by penetrating the semiconductor chip 110. The through silicon via 120 may be formed by forming a via hole and a silicon insulating layer 121 around the via hole and filling a conducting material 122 in the via hole. The through via 120 may receive and transmit an electrical signal through the conducting material 122.

The first metal layer 131 may be coupled to a portion of the through via 120 at an end of the through via 120. The second metal layer 132 may be coupled to another portion of the through via 120 at the end of the through via 120. It is preferred that the first and second metal layers 131 and 132 are not directly coupled to each other. For example as shown in FIG. 2, the first metal layer 131 may be coupled to the left portion of the through via 120 at an upper end of the through via 120. Similarly, the second metal layer 132 may be coupled to the right portion of the through via 120 at the upper end of the through via 120. The first and second metal layers 131 and 132 may not be directly coupled to each other but may be electrically coupled through the conducting material 122 in the through via 120.

The bump 140 may be formed and stacked over the first and second metal layers 131 and 132. The bump 140 may be coupled to a through via of another semiconductor chip (not shown in FIG. 2). When the bump 140 is coupled to a through via of another semiconductor chip, the semiconductor chip 110 may be stacked and electrically coupled to the other semiconductor chip (not shown in FIG. 2), to which the bump 140 is coupled.

Figure 3:
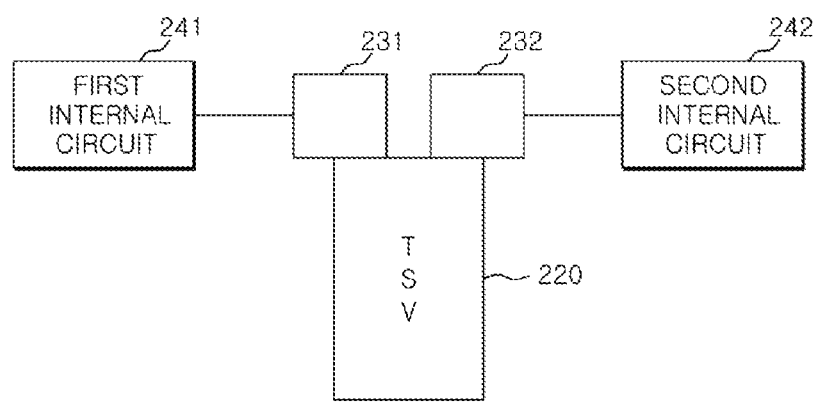
FIG. 3 is a block diagram illustrating a semiconductor apparatus in accordance with an embodiment.

FIG. 3 is a block diagram illustrating a semiconductor apparatus 200 in accordance with another embodiment.

Referring to FIG. 3, the semiconductor apparatus 200, such as shown in FIG. 2, may include a through via TSV 220, first and second metal layers 231 and 232. The first metal layer 231 may be coupled to a first internal circuit 241. Similarly, the second metal layer 232 may be coupled to a second internal circuit 242. Each of the first and second internal circuits 241 and 242 may be formed in the semiconductor chip 110 shown in FIG. 2. Therefore, the first and second internal circuits 241 and 242 may not directly coupled to each other, but may be coupled, as shown in FIG. 3, through the through via 220 and the first and second internal circuits 241 and 242. The through via 220, the first and second metal layers 231 and 232 and the first and second internal circuits 241 and 242 may be formed in a single semiconductor chip.

Figure 4:
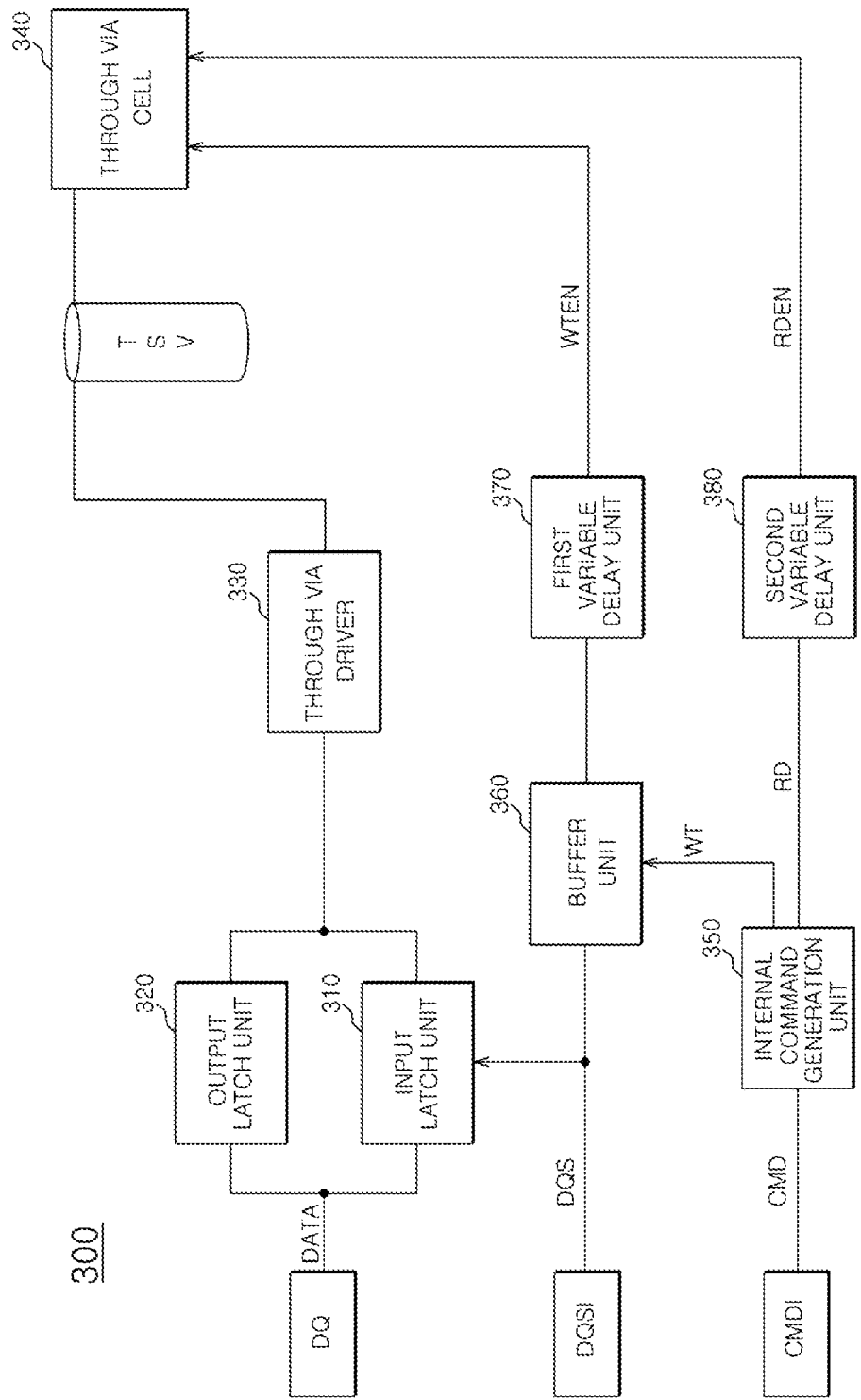
FIG. 4 is a detailed block diagram illustrating the semiconductor apparatus shown in FIG. 3.

FIG. 4 is a detailed block diagram illustrating the semiconductor apparatus 200 shown in FIG. 3.

The semiconductor apparatus 300 may include a through via and a first and a second internal circuits The through via TSV may be coupled to a first and a second metal layer. Further, the TSV shown in FIG. 4 may be the same as shown in FIG. 3.

The first internal circuit may transmit a data DATA to the through via (TSV) or receive a data DATA transmitted through the through via TSV. The first internal circuit may include a data pad DQ, an input latch unit 310, an output latch unit 320 and a through via driver 330. The data pad DQ may receive a data DATA from an external device (not shown in FIG. 4) or output a data DATA to the external device. When the semiconductor apparatus 300 is a memory, the external device may be, for example, a memory controller, a processor device, a host device or a test device. The listed examples should not be construed as limiting. Rather, the semiconductor apparatus 300 may include other devices as well. The external device may control the operation of the semiconductor apparatus 300 by providing the DATA, a command CMD and a strobe signal DQS to the semiconductor apparatus 300.

As shown in FIG. 4, the input latch unit 310 may arrange a data DATA received from the external device through the data pad DQ and output the arranged data. For example, the input latch unit 310 may transform a serial data input from the external device into a parallel data and may output the parallel data. Further, the input latch unit 310 may be controlled by the strobe signal DQS.

The output latch unit 320 may arrange a signal output from the through via TSV and output the arranged data DATA to the data pad DQ. For example, the output latch unit 320 may be a pipe latch for transforming a parallel data output from the through via TSV into a serial data and outputting the serial data.

The through via driver 330 may be coupled to the input latch unit 310, the output latch unit 320 and the through via TSV. The through via driver 330 may drive a data output from the input latch unit 310 and output the data to the through via TSV. The through via driver 330 may drive a signal output from the through via TSV and output the signal to the output latch unit 320.

The second internal circuit (not shown in FIG. 4) may store a signal transmitted through the through via TSV and output a stored signal to the through via TSV. The second internal circuit may include a through via cell 340. The through via cell 340 may store a signal transmitted through the through via TSV in response to a write enable signal WTEN. Further, the through via cell 340 may output a stored signal to the through via TSV in response to a read enable signal RDEN.

As shown in FIG. 4, the semiconductor apparatus 300 may further include a command pad CMDI and an internal command generation unit 350. The command pad CMDI may receive the command signal CMD including a write command signal and a read command signal from the external device. The internal command generation unit 350 may generate an internal write signal WT and an internal read signal RD. The internal read signal RD may be based on the write command signal and the read command signal. The internal command generation unit 350 may generate the internal write signal WT by delaying the write command signal by a first preset time. Further, the internal command generation unit 350 may generate the internal read signal RD by delaying the read command signal by a second preset time. The first and second preset time may be determined with a latency. For example, when the semiconductor apparatus 300 receives a data, the latency may represent an amount of delay time during which the semiconductor apparatus 300 stores a received data therein after the semiconductor apparatus 300 receives the write command signal and a data. When the semiconductor apparatus 300 outputs a data, the latency may represent an amount of delay time during which the semiconductor apparatus 300 outputs a stored data through the data pad DQ after the semiconductor apparatus 300 receives the read command signal. The latency may be changed according to application of the semiconductor apparatus 300.

The semiconductor apparatus 300 may further include a strobe pad DQSI and a buffer unit 360. The strobe pad DQSI may receive the strobe signal DQS from the external device (not shown in FIG. 4). The strobe signal DQS may be input with the data, DATA, in order to inform the semiconductor apparatus 300 of an input timing of the data DATA. The strobe signal DQS input through the strobe pad DQSI may be provided to the input latch unit 310 so that the input latch unit 310 may latch the data DATA received through the data pad DQ in response to the strobe signal DQS.

The buffer unit 360 may receive the strobe signal DQS and the internal write signal WT. Further, the buffer unit 360 may buffer the strobe signal DQS in response to the internal write signal WT. The buffer unit 360 may delay the strobe signal DQS by receiving the internal write signal WT since the internal write signal WT may be delayed by the delay time. The delay time may correspond to the latency after the command signal CMD is input while the strobe signal DQS may not be delayed.

As shown in FIG. 4, the semiconductor apparatus 300 may further include a first variable delay unit 370 and a second variable delay unit 380. The first variable delay unit 370 may generate the write enable signal WTEN by variably delaying the internal write signal WT. The first variable delay unit 370 may generate the write enable signal WTEN by delaying an output of the buffer unit 360. The second variable delay unit 380 may generate the read enable signal RDEN by variably delaying the internal read signal RD. Delay time of the first and second variable delay units 370 and 380 may be arbitrarily changed by a control signal such as a test mode signal. Matters in connection with the delay time of the first and second variable delay units 370 and 380 will be described later.

Figure 5:
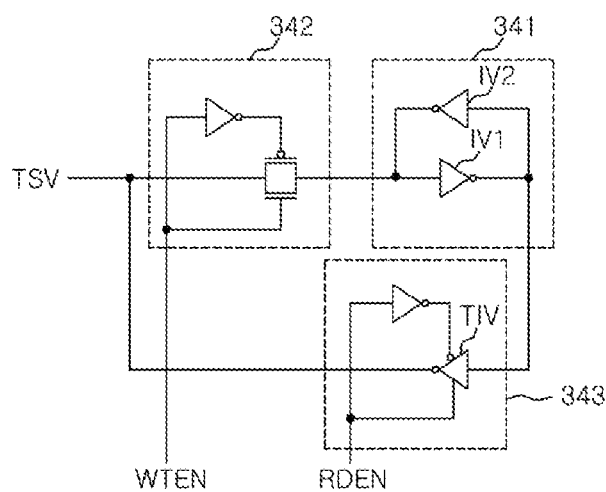
FIG. 5 is a circuit diagram illustrating a through via cell shown in FIG. 4.

FIG. 5 is a circuit diagram illustrating the through via cell 340 shown in FIG. 4.

Referring to FIG. 5, the through via cell 340 may include a latch unit 341, a pass gate 342 and a driver 343. The latch unit 341 may store a signal transmitted through the through via (TSV). The pass gate 342 may couple the through via TSV to the latch unit 341 in response to the write enable signal WTEN. The pass gate 342 may be turned on in response to the write enable signal WTEN and the inverse signal of the write enable signal WTEN. The pass gate 342 may couple the through via TSV to the latch unit 341 when the write enable signal WTEN is enabled. Similarly, the pass gate 342 may disconnect the through via TSV from the latch unit 341 when the write enable signal WTEN is disabled. Therefore, the latch unit 341 may receive and store a signal transmitted through the through via TSV and keep a level of the stored signal when the write enable signal WTEN is enabled.

The latch unit 341 may include first and second inverters IV1 and IV2. An input terminal of the first inverter IV1 may be coupled to the through via TSV. An input terminal of the second inverter IV2 may be coupled to an output terminal of the first inverter IV1 and an output terminal of the second inverter IV2 may be coupled to the input terminal of the first inverter IV1. Drivability of the first inverter IV1 may be greater than drivability of the second inverter IV2, because the latch unit 341 may store a signal more rapidly as drivability of the first inverter IV1 becomes greater than the drivability of the second inverter IV2. The drivability of the first inverter IV may become greater than the drivability of the second inverter IV2 when the latch unit 341 currently stores a signal transmitted through the through via TSV and when the latch unit 341 is used to store a signal that has a level is opposite to a level of the currently stored signal.

As shown in FIG. 5, the driver 343 may include a tri-state inverter (TIV). The tri-state inverter TIV may receive an output of the latch unit 341 at an input terminal of the tri-state inverter TIV. Further, the TIV may be coupled to the through via TSV at an output terminal of the TIV. The tri-state inverter TIV may be enabled in response to the read enable signal RDEN. The tri-state inverter TIV may drive the output of the latch unit 341 and output the output of the latch unit 341 to the through via TSV when the read enable signal RDEN is enabled. Therefore, the driver 343 may output a signal stored in the latch unit 341 to the through via TSV when the read enable signal RDEN is enabled.

In accordance with an embodiment, and as shown in FIG. 4, the semiconductor apparatus 300 may test connectivity of the through silicon via (TSV). FIGS. 6A and 6B show a through the through via normally filled with the conductive material and a through the through via not filled enough with the conductive material, respectively. Operation of the semiconductor apparatus 300 in accordance with an embodiment will be described with reference to FIGS. 4 to 6B.

As shown in FIG. 4, the semiconductor apparatus 300 may receive the data DATA, the strobe signal DQS and the write command signal in order to store the data DATA in the through via cell 340 of the semiconductor apparatus 300. The data DATA may be transferred to the through via TSV through the input latch unit 310 and the through via driver 330. The internal command generation unit 350 may generate the internal write signal WT based on the write command signal and the internal write signal WT may enable the write enable signal WTEN through the first variable delay unit 370. As shown in FIG. 5, when the write enable signal WTEN is enabled, the through via cell 340 may store a signal transferred through the through via TSV in the latch unit 341. As shown in FIG. 6A, when the conductive material 612A is normally filled in the through silicon via 610A, the first metal layer 620A and the second metal layer 630A may be electrically coupled to each other. Thus, a signal that is transferred through the through via 610A may be stored in the latch unit 341 (shown in FIG. 5). However, as shown in FIG. 6B, when the conductive material 612B is not filled enough in the through via 610B, the first metal layer 620B and the second metal layer 630B may not be electrically coupled to each other. Therefore, a signal output through the through via driver 330 based on the data DATA may not be transferred to the through via 610B and the latch unit 341 (shown in FIG. 5) may not receive a signal from the through via 610B.

After that described by Para. [0041], the read enable signal RDEN (as shown in FIG. 4) may be enabled by the internal command generation unit 350 and the second variable delay unit 380 when the read command signal is input. A signal stored in the latch unit 341 (as shown in FIG. 5) may be output to the through via TSV through the driver 343 when the read enable signal RDEN is enabled. The signal received through the through via TSV may be output as the data DATA through the through silicon via driver 330 (as shown in FIG. 4) and the output latch unit 320. It may be determined that the conductive material is normally filled in the through via TSV when the output data is the same as the input data. It may be determined that the conductive material is not filled enough in the through via TSV and the through the through via TSV is defective when the output data is not the same as the input data.

Detailed filling status of the conductive material of the through the through via TSV may be identified by the first and second variable delay units 370 and 380. FIG. 6C shows a through the through via not normally filled with the conductive material. Referring to FIG. 6C, the conductive material 612C is slightly contacted with the first metal layer 620C and the second metal layer 630C even though the conductive material 612C are not fully filled in the through via 610C. Therefore, as shown in FIG. 6C, the first metal layer 620C and the second metal layer 630C may be electrically coupled to each other. However, there may be a longer delay in signal transmission and reception in comparison to an instance where the conductive material is normally filled, as shown in FIG. 6A, since the contact area of the conductive material 612C, as shown in FIG. 6C, in contact to the first metal layer 620C and the second metal layer 630C is small.

Under the such an instance as shown in FIG. 6C, a signal transferred through the through via TSV may not be stored in the latch unit 341 (as shown in FIG. 5) and an output data, which is different from the input data, may be output when the write enable signal WTEN and the read enable signal RDEN are generated at normal timing. Therefore, the semiconductor apparatus 300 may compensate for the delay, which occurs on account of the through via TSV being not fully filled with the conductive material, when the first and second variable delay units 370 and 380 delay generating the write enable signal WTEN and the read enable signal RDEN with a preset amount of time. Therefore, an output data, which is the same as the input data, may be output and it may be determined that the through via is not normally filled with the conductive material such as shown in FIG. 6C. Further, it may be determined, in more sufficient detail, the amount of the conductive material that is filled in the through silicon via TSV as related to the amount of delay of the first and second variable delay units 370 and 380.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should be construed in light of the claims that follow when interpreted with the above description and accompanying figures.

What is claimed is:

1. A semiconductor apparatus comprising:
   a semiconductor chip;
   a through via formed by penetrating through the semiconductor chip;

a first metal layer coupled to a portion of the through via at an end of the through via; and a second metal layer coupled to another portion of the through via at the end of the through via.

2. The semiconductor apparatus of claim 1, wherein the first and second metal layers are not directly coupled to each other.

3. The semiconductor apparatus of claim 1, further comprising:

a bump stacked over the first and second metal layers wherein the bump is coupled in common to both the first and second metal layers.

4. The semiconductor apparatus of claim 1, wherein the first metal layer is coupled to a first internal circuit of the semiconductor chip.

5. The semiconductor apparatus of claim 4, wherein the second metal layer is coupled to a second internal circuit of the semiconductor chip.

6. A semiconductor apparatus comprising:

a through via;

a first metal layer coupled to a portion of the through via at an end of the through via;

a second metal layer coupled to another portion of the through silicon via at the end of the through via;

a first internal circuit coupled to the first metal layer and configured to transmit a signal to the through via or receive a signal transferred through the through via; and a second internal circuit coupled to the second metal layer and configured to store a signal transferred through the through via and output the stored signal to the through via.

7. The semiconductor apparatus of claim 6, wherein the first and second metal layers are not directly coupled to each other.

8. The semiconductor apparatus of claim 6, wherein the first internal circuit transmits a data to the through via or receives a data output from the through via.

9. The semiconductor apparatus of claim 8, wherein the first internal circuit further comprises:

a data pad configured to input and/or output a data;

an input latch unit configured to arrange the data received through the data pad and to output the arranged data;

an output latch unit configured to arrange a signal output through the through via and to output the arranged signal as a data to the data pad; and a through via driver configured to drive the data output from the input latch unit and to output the resultant data to the through via and to drive the signal output from the through via and output the resultant signal to the output latch unit.

10. The semiconductor apparatus of claim 8, wherein the second internal circuit further comprises:

a through via cell configured to store a signal transmitted through the through via wherein the signal is stored in response to a write enable signal and output a stored signal to the through via in response to a read enable signal.

11. The semiconductor apparatus of claim 10, wherein the through via cell further comprises:

a latch unit configured to latch a signal transmitted through the through via;

a pass gate configured to electrically connect the through via to the latch unit in response to the write enable signal;

a driver configured to output a signal stored in the latch unit to the through via in response to the read enable signal.

12. The semiconductor apparatus of claim 10, further comprising:

a command pad configured to receive a write command signal and a read command signal; and an internal command generation unit configured to generate an internal write signal and an internal read signal based on the write command signal and the read command signal.

13. The semiconductor apparatus of claim 12, further comprising:

a first variable delay unit configured to generate the write enable signal by variably delaying the internal write signal; and a second variable delay unit configured to generate the read enable signal by variably delaying the internal read signal.

14. The semiconductor apparatus of claim 12, further comprising:

a strobe pad configured to receive a strobe signal; and a buffer unit configured to buffer the strobe signal in response to the internal write signal.

* * * * *